United States Patent
Otsuka et al.

(10) Patent No.: US 12,248,066 B2
(45) Date of Patent: Mar. 11, 2025

(54) LIGHT DETECTION DEVICE, LIDAR DEVICE INCLUDING THE SAME, AND METHOD OF MEASURING DISTANCE

(71) Applicant: SAMSUNG ELECTRONICS CO., LTD., Suwon-si (KR)

(72) Inventors: Tatsuhiro Otsuka, Suwon-si (KR); Jungwoo Kim, Hwaseong-si (KR); Yongchul Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 995 days.

(21) Appl. No.: 17/236,619

(22) Filed: Apr. 21, 2021

(65) Prior Publication Data

US 2022/0155442 A1 May 19, 2022

(30) Foreign Application Priority Data

Nov. 13, 2020 (KR) .................. 10-2020-0152286

(51) Int. Cl.
*G01S 17/08* (2006.01)
*G01S 7/481* (2006.01)
*H03F 3/45* (2006.01)

(52) U.S. Cl.
CPC ............ *G01S 17/08* (2013.01); *G01S 7/4816* (2013.01); *H03F 3/45475* (2013.01)

(58) Field of Classification Search
CPC ...... G01S 17/08; G01S 7/4816; G01S 7/4914; G01S 17/931; G01S 7/4815; G01S 7/4863; G01S 7/4865; G01S 7/4876; G01S 17/89; G01S 17/42; G01S 7/481; G01S 7/484; H03F 3/45475; H03F 3/08; G02B 27/30

See application file for complete search history.

(56) References Cited

U.S. PATENT DOCUMENTS

| | | | |
|---|---|---|---|
| 9,551,575 B2 * | 1/2017 | Bridges | G01S 17/36 |
| 10,488,496 B2 | 11/2019 | Campbell et al. | |
| 10,551,501 B1 * | 2/2020 | LaChapelle | G01S 7/4818 |
| 10,557,939 B2 | 2/2020 | Campbell et al. | |
| 11,119,219 B1 * | 9/2021 | LaChapelle | H01S 5/0265 |

(Continued)

FOREIGN PATENT DOCUMENTS

| | | | |
|---|---|---|---|
| JP | 201568804 A | 4/2015 | |
| JP | 6421368 B2 | 11/2018 | |

(Continued)

*Primary Examiner* — Assres H Woldemaryam
(74) *Attorney, Agent, or Firm* — Sughrue Mion, PLLC

(57) ABSTRACT

A light detection device may include: a light receiver comprising a plurality of light detectors configured to receive light emitted from a light emitter toward an object and reflected by the object; and a signal processor configured to process an electrical signal according to the light received by the light receiver. The light receiver includes at least one light receiving area, wherein each of the at least one light receiving area includes a plurality of sub-light receiving areas, and the plurality of light detectors are disposed in the plurality of sub-light receiving areas, respectively. The signal processor includes a plurality of transimpedance amplifiers that have a one-on-one correspondence with the plurality of light detectors, and at least one signal summer that has the one-on-one correspondence with the at least one light receiving area.

24 Claims, 13 Drawing Sheets

(56) References Cited

U.S. PATENT DOCUMENTS

| | | | | |
|---|---|---|---|---|
| 2013/0027715 A1* | 1/2013 | Imaki | ............... | G01S 17/10 |
| | | | | 356/601 |
| 2017/0131388 A1 | 5/2017 | Campbell et al. | | |
| 2019/0079166 A1* | 3/2019 | Kim | ............... | G01S 7/4915 |
| 2020/0057151 A1* | 2/2020 | Finkelstein | ............... | G01S 7/4876 |
| 2020/0072946 A1* | 3/2020 | Fisher | ............... | G01S 7/4863 |
| 2020/0088850 A1 | 3/2020 | Mheen et al. | | |
| 2020/0284884 A1* | 9/2020 | Henderson | ............... | H04N 25/773 |
| 2021/0025994 A1* | 1/2021 | Patil | ............... | G01S 7/4865 |
| 2021/0132202 A1* | 5/2021 | Liu | ............... | G01S 7/4816 |
| 2022/0130060 A1* | 4/2022 | Aßmann | ............... | G01S 7/483 |

FOREIGN PATENT DOCUMENTS

| | | |
|---|---|---|
| KR | 1020190030027 A | 3/2019 |
| KR | 102038533 B1 | 10/2019 |
| KR | 102086026 B1 | 3/2020 |
| KR | 1020200033068 A | 3/2020 |

* cited by examiner

LIGHT DETECTION DEVICE, LIDAR DEVICE INCLUDING THE SAME, AND METHOD OF MEASURING DISTANCE

CROSS-REFERENCE TO RELATED APPLICATION

This application is based on and claims priority from Korean Patent Application No. 10-2020-0152286, filed on Nov. 13, 2020, in the Korean Intellectual Property Office, the disclosure of which is incorporated herein by reference in its entirety.

BACKGROUND

1. Field

The present disclosure relates to a light detection device, a light detection and ranging (LiDAR) device including the light detection device, and a method of measuring a distance using the LIDAR device.

2. Description of the Related Art

A light detection and ranging (LiDAR) system has been applied to various fields, such as space aeronautics, geology, three-dimensional maps, automobiles, robots, drones, etc.

As a basic operation principle, the LiDAR system uses the time of flight principle (hereinafter, referred to as the "ToF"). That is, light may be emitted from a light source toward an object and then, the light reflected from the object may be received by a sensor. A high speed electrical circuit may measure the ToF of the light that represents a time difference between the emitted light and the received light, and a processor may calculate a distance to the object based on the ToF, and may generate a depth image of the object based on information about the distance to the object.

According to this method, not only the light from the light source, but also external light, such as the sunlight, may be received by the sensor. Thus, when measuring the time of flight of light, light including noise may be used, and thus the accuracy of the measurement of the ToF may be deteriorated unless the noise is effectively reduced.

SUMMARY

One or more example embodiments provide a light detection device having a structure for receiving reduced noise, a light detection and ranging (LiDAR) device capable of improving the accuracy of measurement of time of flight of light by including the light detection device, and a method of measuring a distance.

One or more example embodiments provide an optical sensor or a depth sensor for reducing the effects of ambient-noise light (e.g., sunlight) using a plurality of light detectors that have a one-to-one correspondence with a plurality of light emitters (e.g., a plurality of laser chips).

Additional aspects will be set forth in part in the description which follows and, in part, will be apparent from the description, or may be learned by practice of the presented embodiments of the disclosure.

According to an aspect of an embodiment, there is provided a light detection device for detecting light, emitted from a light emitter to an object and then reflected by the object. The light detection device may include: a light receiver including a plurality of light detectors configured to receive the light emitted from the light emitter toward the object and reflected by the object; and a signal processor configured to process an electrical signal according to the light received by the light receiver, wherein the light receiver may include at least one light receiving area, wherein each of the at least one light receiving area may include a plurality of sub-light receiving areas, and the plurality of light detectors may be disposed in the plurality of sub-light receiving areas, respectively. The signal processor may include a plurality of transimpedance amplifiers (TIAs) that have a one-on-one correspondence with the plurality of light detectors, and at least one signal summer that has a one-on-one correspondence with the at least one light receiving area.

Each of the at least one light receiving area may correspond to one pixel of the light receiver.

The plurality of sub-light receiving areas may be provided by dividing any one of the at least one light receiving area into N areas, and N is a natural number.

A size of each of the plurality of sub-light receiving areas may be less than a light incident area to which the light reflected from the object is incident.

The light receiver may include a plurality of light receiving areas including the at least one light receiving area. The signal processor may include a plurality of signal summers including the at least one signal summer, wherein the plurality of signal summers may have the one-on-one correspondence with the plurality of light receiving areas. The plurality of TIAs may include a plurality of first TIAs and a plurality of second TIAs. The plurality of light detectors may include a plurality of first light detectors disposed in a first light receiving area among the plurality of light receiving areas, and a plurality of second light detectors disposed in a second light receiving area among the plurality of light receiving areas. The plurality of signal summers may include: a first signal summer configured to sum first voltage signals converted by the plurality of first TIAs that are connected to the plurality of first light detectors, respectively; and a second signal summer configured to sum second voltage signals converted by the plurality of second TIAs that are connected to the plurality of second light detectors, respectively.

The signal processor may include a plurality of offset removal filters that are connected to the plurality of TIAs, respectively.

The signal processor may include a plurality of amplifiers that are connected to the plurality of TIAs, respectively.

The plurality of light detectors may include at least one of an avalanche photo diode and a single photon avalanche diode.

According to an aspect of another example embodiment, there is provided a light detection and ranging (LiDAR) device including: a light emitter configured to emit light; a light detection device including: a light receiver including a plurality of light detectors configured to receive the light emitted from the light emitter toward an object and reflected by the object; and a signal processor configured to process an electrical signal according to the light received by the light receiver; and a processor configured to calculate a time of flight (ToF) of the light by using the electrical signal processed by the signal processor. The light receiver may include at least one light receiving area, wherein each of the at least one light receiving area includes a plurality of sub-light receiving areas, and the plurality of light detectors are disposed in the plurality of sub-light receiving areas, respectively. The signal processor may include a plurality of transimpedance amplifiers (TIAs) that have a one-on-one correspondence with the plurality of light detectors, and at least one signal summer that has a one-on-one correspondence with the at least one light receiving area.

Each of the at least one light receiving area may correspond to one pixel of the light receiver.

The plurality of sub-light receiving areas may be provided by dividing any one of the at least one light receiving area into N areas, and N is a natural number.

A size of each of the plurality of sub-light receiving areas may be less than an area of an light incident area to which the light reflected from the object is incident.

The light receiver may include a plurality of light receiving areas including the at least one light receiving area, the signal processor may include a plurality of signal summers including the at least one signal summer, wherein the plurality of signal summers may have the one-on-one correspondence with the plurality of light receiving areas. The plurality of TIAs may include a plurality of first TIAs and a plurality of second TIAs. The plurality of light detectors may include a plurality of first light detectors disposed in a first light receiving area among the plurality of light receiving areas, and a plurality of second light detectors disposed in a second light receiving area among the plurality of light receiving areas. The plurality of signal summers may include: a first signal summer configured to sum first voltage signals converted by the plurality of first TIAs that are connected to the plurality of first light detectors, respectively; and a second signal summer configured to sum second voltage signals converted by the plurality of second TIAs that are connected to the plurality of second light detectors, respectively.

The signal processor may include a plurality of offset removal filters that are connected to the plurality of TIAs, respectively.

The signal processor may include a plurality of amplifiers that are connected to the plurality of TIAs, respectively.

The LiDAR device may further include a plurality of light emitters including the light emitter, wherein the plurality of light emitters may be configured to emit a plurality of light beams to different positions in the object.

The LiDAR device may further include a beam steering device configured to steer a travel direction of the light to have the light incident on the object.

The LiDAR device may further include a collimator configured to collimate the light emitted from the light emitter.

The LiDAR device may further include a light-receiving optical element arranged on an entire surface of the light receiver and configured to focus the light reflected by the object onto the light detection device.

The light receiver may include a plurality of light receiving areas, and the plurality of light receiving areas may be arranged in different light receiving locations to detect the light reflected from different locations of the object and incident into the different light receiving locations.

According to an aspect of another example embodiment, there is provided a method of measuring a distance, the method including: radiating a plurality of light beams toward an object by using a light source; receiving the plurality of light beams through a plurality of sub-light receiving areas, respectively, wherein the plurality of light beams that are radiated from the light source is reflected by the object and incident into a light receiving area including the plurality of sub-light receiving areas; converting each of a plurality of electrical signals individually, according to the plurality of light beams that are received through the plurality of sub-light receiving areas; summing the converted plurality of electrical signals; and calculating a time of flight (ToF) of the plurality of light beams based on a sum of the converted plurality of electrical signals.

The method may further include, after performing the converting, and before performing the summing, removing offsets from the plurality of converted electrical signals, respectively, for each of the plurality of sub-light receiving areas.

A size of each of the plurality of sub-light receiving areas may be less than a light incident area to which the plurality of light beams that are reflected from the object are incident.

The light receiving area may correspond to one pixel with respect to the object.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
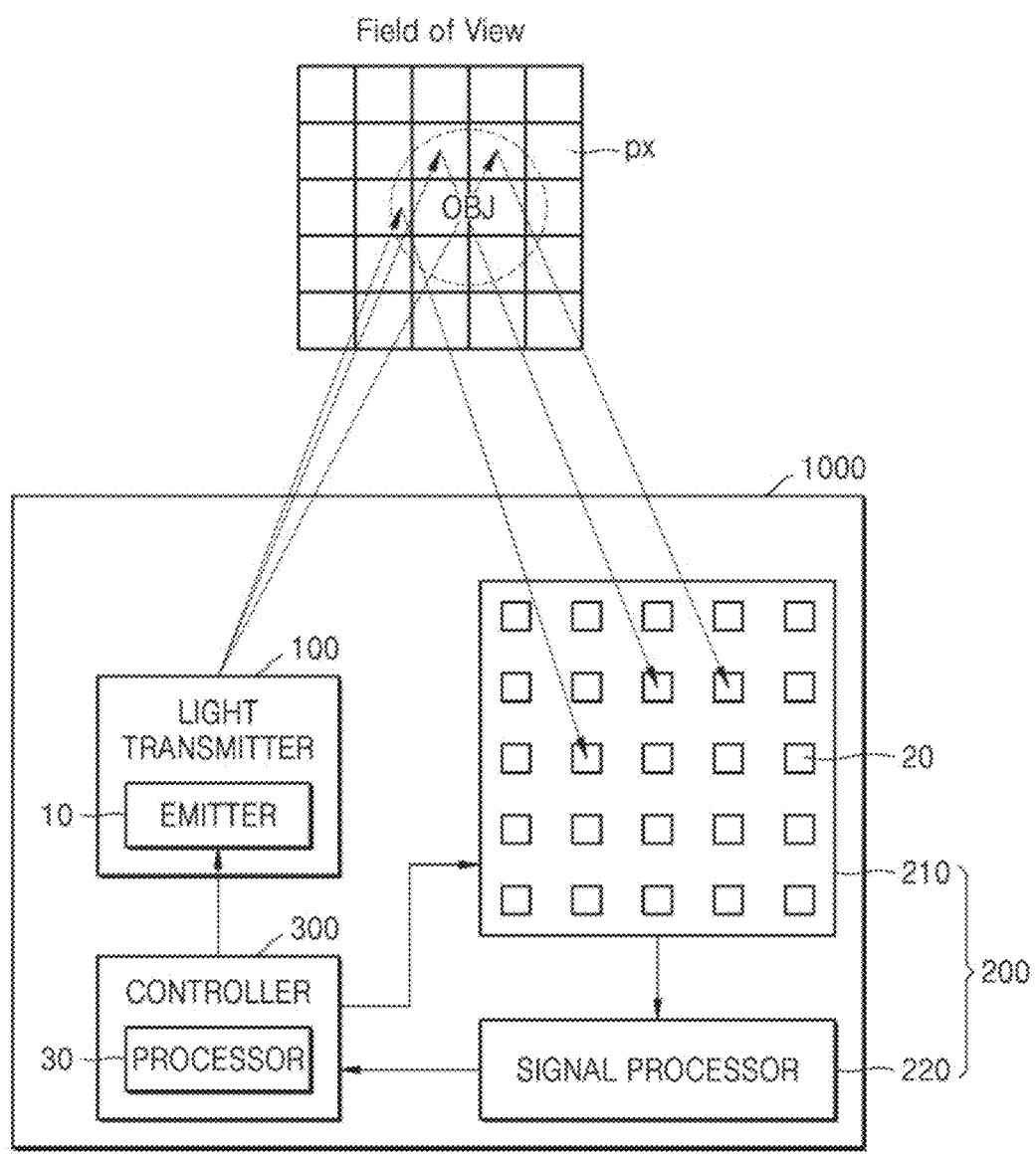
FIG. 1 is a schematic diagram of an example structure of a light detection and ranging (LiDAR) device, according to an example embodiment.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list. entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

In the drawings, sizes or thicknesses of elements may be exaggerated for clarity and convenience of explanation.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. Operations included in a method may be performed in an appropriate order, unless the operations included in the method are described to be performed in an apparent order, or unless the operations included in the method are described to be performed otherwise. The operations are not necessarily limited to the described order.

Although the terms "first," "second," etc. may be used herein to describe various elements, these terms do not limit the components. These terms are only used to distinguish one element from another. The light detection device, the LiDAR device including the light detection device, and the method of measuring a distance may be realized in various different forms and are not limited to the example embodiments described hereinafter.

Figure 2:
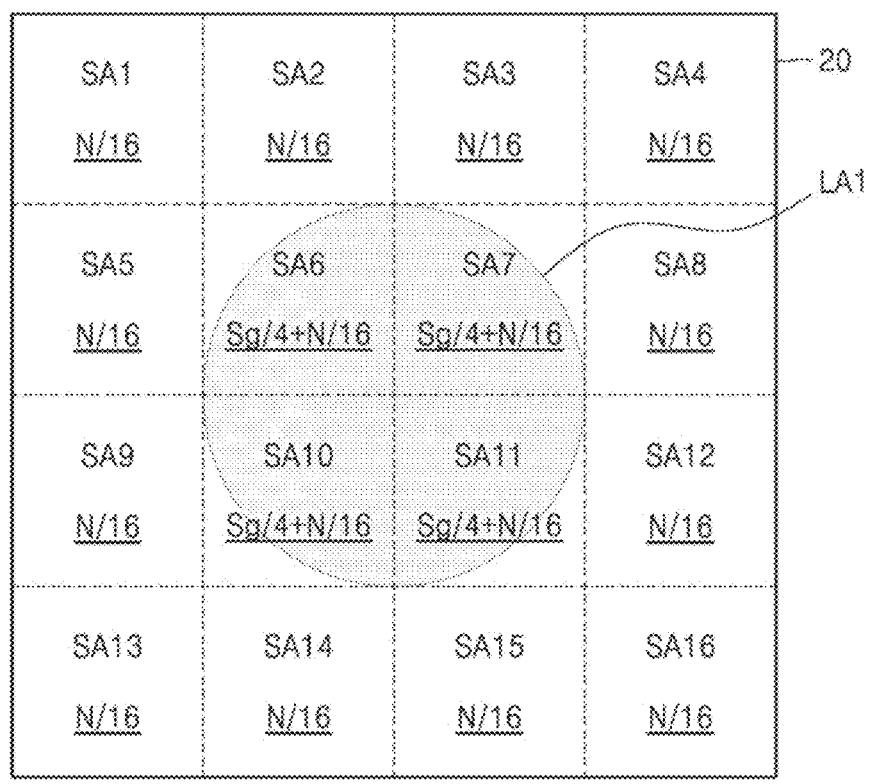
FIG. 2 is a schematic diagram of an example structure of any one of at least one of light receiving areas included in a light receiver of FIG. 1.
Figure 3:
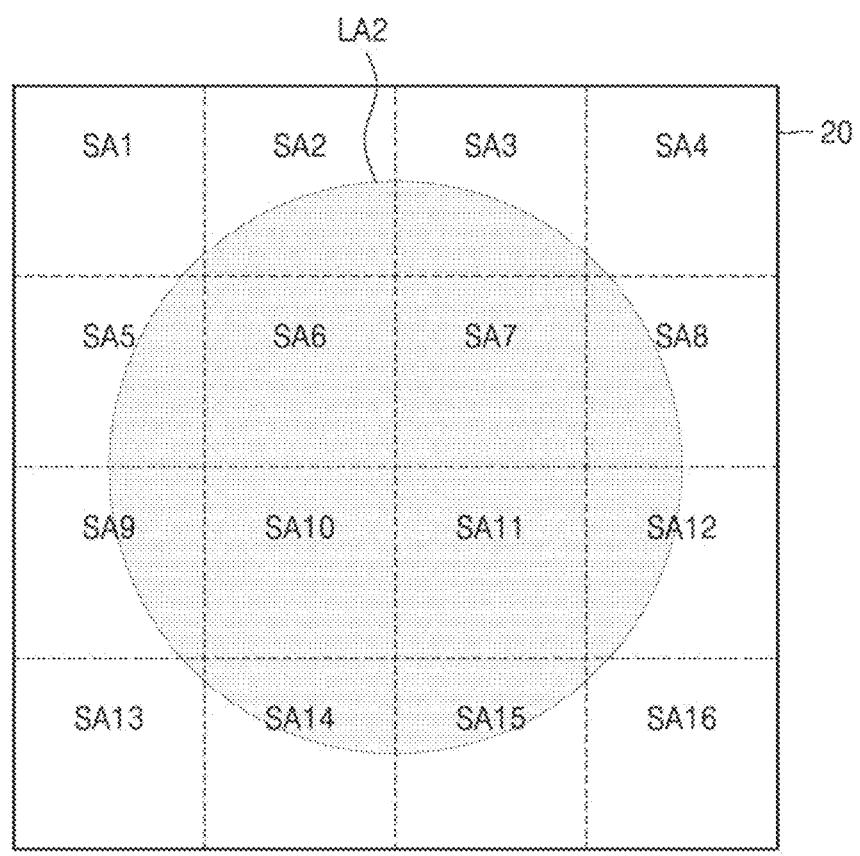
FIG. 3 is a schematic diagram of an example structure of any one of at least one of light receiving areas included in the light receiver of FIG. 1.
Figure 4:
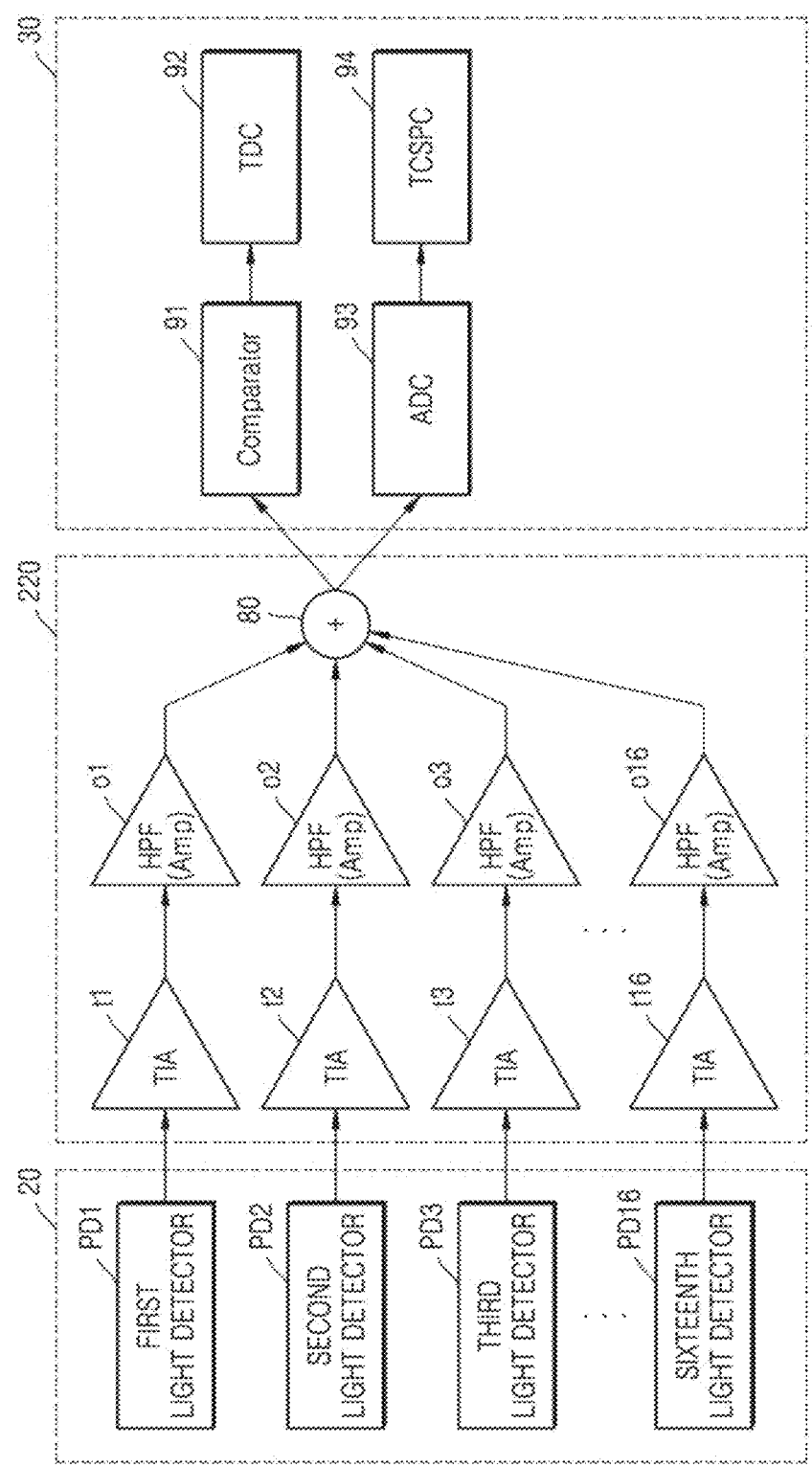
FIG. 4 is a schematic diagram of example structures of any one of at least one of light receiving areas included in the light receiver of FIG. 1, a signal processor, and a processor.

FIG. 1 is a schematic diagram of an example structure of a LiDAR device 1000, according to an example embodiment. FIG. 2 is a schematic diagram of an example structure of any one of at least one of light receiving areas 20 included in a light receiver 210 of FIG. 1. FIG. 3 is a schematic diagram of an example structure of any one of at least one of light receiving areas included in the light receiver 210 of FIG. 1. FIG. 4 is a schematic diagram of example structures of any one of the at least one of light receiving areas 20 included in the light receiver 210 of FIG. 1, a signal processor 220, and a processor 30.

Referring to FIG. 1, the LiDAR device 1000 according to an example embodiment may include a light transmitter 100 including an emitter 10 configured to emit light toward an object OBJ, a light detection device 200 configured to detect light that is reflected by the object OBJ after being emitted from the light transmitter 100 toward the object OBJ, and the processor 30 configured to calculate a time of flight (ToF) of the light by using an electrical signal based on the light received by the light detection device 200.

The light detection device 200 may include the light receiver 210 and the signal processor 220. The light receiver 210 may include a plurality of light detectors configured to receive the light reflected by the object OBJ after being emitted from the emitter 10 toward the object OBJ. The signal processor 220 may be configured to process an electrical signal based on the light received by the light receiver 210. The processor 30 may be configured to calculate the ToF of the light by using the electrical signal processed by the signal processor 220. The LiDAR device 1000 may include a controller 300 configured to control operations of the light transmitter 100 and the light receiver 210. The processor 30 may be included in the controller 300.

The emitter 10 may include a light-emitting device. For example, the emitter 10 may include any of light-emitting devices, such as a laser diode (LD), an edge emitting laser, a vertical-cavity surface emitting laser (VCSEL), a distributed feedback laser, a light-emitting diode (LED), and a super luminescent diode (SLD). The emitter 10 may generate light which may be used for an analysis of a location and a shape of the object OBJ. The emitter 10 may generate the light in a wavelength range that is suitable for the analysis of the location and the shape of the object OBJ. For example, the emitter 10 may generate and emit the light in an infrared wavelength range. When the light in the infrared wavelength range is used, mixing of natural light in a visible light area, such as sunlight, may be prevented. However, the light generated and emitted by the emitter 10 is not limited to the light in the infrared wavelength range. The emitter 10 may emit light of various wavelength ranges. The emitter 10 may generate a pulsed wave or a continuous wave.

The light transmitter 100 may change a propagation direction of the light emitted from the emitter 10 to be toward the object OBJ. The light transmitter 100 may emit the light over a predetermined area, thereby forming a predetermined field of view. For example, the light transmitter 100 may emit the light toward an area in which the object OBJ is included, thereby forming a field of view. For example, in order to scan the area in which the object OBJ is included, the light transmitter 100 may form the field of view via the light emitted from the emitter 10 by appropriately adjusting a location of the emitter 10 on a three-dimensional space. Through the field of view, the area in which the object OBJ is included may be scanned. For example, a 5×5 sized field of view including 25 pixels px may be formed by the light emitted from the light transmitter 100. FIG. 1 illustrates the 5×5 sized field of view. However, it is only for convenience of explanation, and an example embodiment is not limited thereto.

The emitter 10 may generate a point light source. Here, the point light source may indicate a light source corresponding to any one of the plurality of pixels px included in the field of view. The light-transmitter 100 may further include a predetermined optical system configured to change a propagation path of the light emitted from the emitter 10. Accordingly, the light generated from the emitter 10 and emitted from the point light source may have a changed propagation direction via the light transmitter 100 and may be transmitted to the object OBJ so as to form the plurality of pixels px in the field of view. In other words, while the propagation direction of the light generated from the emitter 10 and emitted from the point light source is sequentially changed by the light transmitter 100, the plurality of pixels px may be sequentially formed so as to form the predetermined field of view.

The light transmitter 100 may include the emitter 10 in a multiple number. In this case, the predetermined field of view may be formed by a plurality of light beams emitted from a plurality of emitters 10. The plurality of light beams may be incident on different locations in the object OBJ. Accordingly, compared with when the light transmitter 100 includes one emitter 10, when the light transmitter 100 includes the plurality of emitters 10, the predetermined field of view may be formed earlier. An example structure of the light transmitter 100 including the plurality of emitters 10 will be described below with reference to FIG. 10.

The light receiver 210 may include the at least one of light receiving areas 20 configured to receive the light emitted from the point light source generated by the emitter 10 and reflected by the object OBJ. For example, the light receiver 210 may include the plurality of light receiving areas 20 configured to detect the light reflected from the object OBJ separately according to each of different locations of the object OBJ. However, the light receiver 210 is not limited thereto and may include only one light receiving area 20.

When the light receiver 210 includes the plurality of light receiving areas 20, the plurality of light receiving areas 20 may be arranged, for example, in a two-dimensional array. The plurality of light receiving areas 20 may be arranged in different light-receiving locations, so as to detect the light reflected from the different locations of the object OBJ and incident into the different light-receiving locations. FIG. 1 illustrates the structure in which the plurality of light receiving areas 20 are arranged in a two-dimensional array. However, it is an example. The plurality of light receiving areas 20 may be one-dimensionally arranged.

In order that the LiDAR device 1000 may relatively more accurately measure the ToF of light, it may be required to minimize the noise occurrence due to external light (e.g., sunlight). FIG. 2 illustrates an example structure of each of the plurality of light receiving areas 20 according to an example embodiment, the structure of each of the plurality of light receiving areas 20 being configured to minimize the effects of external light.

Referring to FIG. 2, each of the plurality of light receiving areas 20 may include a plurality of sub-light receiving areas SA1 through SA16. Each of the plurality of light receiving areas 20 may correspond to one pixel of the light receiver 210. Accordingly, to divide each of the plurality of light receiving areas 20 into the plurality of sub-light receiving areas SA1 through SA16 may be the same as to divide one pixel of the light receiver 210 into a plurality of areas.

The plurality of sub-light receiving areas SA1 through SA16 may be formed by dividing any one of the plurality of light receiving areas 20 into N (N is a natural number) areas. Areas of the plurality of sub-light receiving areas SA1 through SA16 may be the same as each other. However, it is not limited thereto. Areas of at least two of the plurality of sub-light receiving areas SA1 through SA16 may be different from each other. Referring to FIG. 2, one light receiving area 20 may be divided into, for example, 16 areas. That is, one light receiving area 20 may include 16 sub-light receiving areas SA1 through SA16. However, it is only an example. Embodiments of the disclosure are not limited thereto. Any one of the at least one of light receiving areas 20 may be divided into more or less sub-light receiving areas than 16 sub-light receiving areas.

A plurality of light detectors (PD1, PD2, PD3, . . . , and PD16 of FIG. 4) may be provided in the plurality of sub-light receiving areas SA1 through SA16, respectively. The light emitted from the emitter 10 and reflected by the object OBJ may be incident into only some of the plurality of sub-light receiving areas SA1 through SA16. In other words, an area of an incident area LA1 of the light emitted from the emitter 10 toward the object OBJ and reflected and incident from the object OBJ may be less than an area of each of the at least one of light receiving areas 20. Also, the area of the incident area LA1 of the light emitted from the emitter 10 toward the object OBJ and reflected and incident from the object OBJ may be greater than an area of each of the plurality of sub-light receiving areas SA1 through SA16.

Referring to FIG. 2, for example, the light emitted from the emitter 10 and reflected by the object OBJ may be incident into only some sub-light receiving areas SA6, SA7, SA10, and SA11 in the middle of the light receiving area 20 from among the plurality of sub-light receiving areas SA1 through SA16. However, the disclosure is not limited thereto. As illustrated in FIG. 3, an incident area LA2 of the light emitted from the emitter 10 and reflected by the object OBJ may correspond to all the sub-light receiving areas SA1 through SA16. Hereinafter, descriptions will be given based on a case in which the light emitted from the emitter 10 and reflected by the object OBJ is incident into some sub-light receiving areas SA6, SA7, SA10, and SA11, as illustrated in FIG. 2.

As illustrated in FIG. 2, when an intensity of light that is emitted from the emitter 10, reflected from the object OBJ, and incident into any one of the at least one of light receiving areas 20 is "Sg," an intensity of light that is reflected by the object OBJ and incident into each of some sub-light receiving areas SA6, SA7, SA10, and SA11 may be "Sg/4." However, the disclosure is not limited thereto. Intensities of the light reflected by the object OBJ and incident into some sub-light receiving areas SA6, SA7, SA10, and SA11 may be slightly different between each other according to a shape and a location of the incident area LA1 of the light reflected and incident from the object OBJ. Hereinafter, descriptions will be given assuming that the amount of light that is reflected by the object OBJ and incident into each of some sub-light receiving areas SA6, SA7, SA10, and SA11 is the same as each other.

An intensity of external light (for example, sunlight) that is incident into any one of at least one of light receiving areas 20 may be "N." The external light may cause noise. An intensity of the external light that is incident into each of the plurality of sub-light receiving areas SA1 through SA16 may be "N/16." However, the intensity of the external light that is incident into each of a plurality of sub-light receiving areas is not limited thereto and may vary according to the number of sub-light receiving areas. Hereinafter, for convenience of explanation, descriptions will be given based on a case in which the number of sub-light receiving areas SA1 though SA16 is 16. As described above, the case in which the intensity of the external light that is incident into each of the plurality of sub-light receiving areas SA1 through SA16 is "N/16" may correspond to a case in which the plurality of sub-light receiving areas SA1 through SA16 may correspond to 16 sub-light receiving areas having the same area as each other. However, the disclosure is not limited thereto. When the plurality of sub-light receiving areas SA1 though SA16 have different areas from each other, the intensity of the external light that is incident into each of the plurality of sub-light receiving areas SA1 through SA16 may be different from each other according to an area of each of the plurality of sub-light receiving areas SA1 through SA16.

Referring to FIG. 2, an intensity of light that is incident into each of some sub-light receiving areas SA6, SA7, SA10, and SA11, into which both of the light emitted from the emitter 10 and reflected by the object OBJ and the external light are incident, from among the plurality of sub-light receiving areas SA1 through SA16, may be "Sg/4+N/16."

Referring to FIG. 4, the one or more light receiving areas 20 may include the plurality of light detectors PD1, PD2, PD3, . . . , and PD16. For example, the plurality of light detectors PD1, PD2, PD3, . . . , and PD16 may be provided in the plurality of sub-light receiving areas SA1, SA2, SA3, . . . , and SA16, respectively. FIG. 4 illustrates an example in which there are 16 light detectors PD1, PD2, PD3, . . . , and PD16. However, example embodiments of the disclosure are not limited thereto. When the number of sub-light receiving areas SA1, SA2, SA3, . . . , and SA16 included in each of the one or more light receiving areas 20 is greater than 16, the number of light detectors PD1, PD2, PD3, . . . , and PD16 may be greater than 16. In other words, the number of light detectors PD1, PD2, PD3, . . . , and PD16 may correspond to the number of sub-light receiving areas SA1, SA2, SA3, . . . , and SA16.

The plurality of light detectors PD1, PD2, PD3, . . . , and PD16 may include sensors configured to sense light, for example, a light receiving device configured to generate an electrical signal by using light energy. For example, the plurality of light detectors PD1, PD2, PD3, . . . , and PD16 may generate a current by using energy of incident light. The light receiving device is not limited to particular types. The plurality of light detectors PD1, PD2, PD3, . . . , and PD16 may include any one of an avalanche photon diode (APD) and a single photo avalanche diode (SPAD), having a high sensing sensitivity.

The current generated by the plurality of light detectors PD1, PD2, PD3, . . . , and PD16 may be transmitted to the signal processor 220. The signal processor 220 may include a plurality of transimpedance amplifiers (TIAs) t1, t2, t3, . . . , and t16 provided based on a one-on-one correspondence with respect to the plurality of light detectors PD1, PD2, PD3, . . . , and PD16.

Referring to FIG. 4, a current signal according to the light received by a first light detector PD1 may be converted into a voltage signal by a first TIA t1. Also, a current signal according to the light received by a second light detector PD2 may be converted into a voltage signal by a second TIA t2. Based on this method, a current signal according to the light received by a sixteenth light detector PD16 may be converted into a voltage signal by a sixteenth TIA t16.

The signal processor 220 may further include a plurality of offset removal filters o1, o2, o3, . . . , and o16 provided based on a one-on-one correspondence with respect to the plurality of TIAs t1, t2, t3, . . . , and t16. The plurality of offset removal filters o1, o2, o3, . . . , and o16 may include a high pass filter (HPF) or a low pass filter (LPF). FIG. 4 illustrates a case in which the plurality of offset removal filters o1, o2, o3, . . . , and o16 are HPFs. The plurality of offset removal filters o1, o2, o3, . . . , and o16 may be configured to remove at least a portion of an offset by external light incident into the plurality of light detectors PD1, PD2, PD3, . . . , and PD16.

For example, a first offset removal filter o1 may be electrically connected to the first TIA t1. Thus, the first offset removal filter o1 may remove at least a portion of an offset by external light incident into the first light detector PD1 and having an intensity of N/16. Also, a second offset removal filter o2 may be electrically connected to the second TIA t2. Thus, the second offset removal filter o2 may remove at least a portion of an offset by external light incident into the second light detector PD2 and having an intensity of N/16. Based on this method, a sixteenth offset removal filter o16 may be electrically connected to the sixteenth TIA t16. Thus, the sixteenth offset removal filter o16 may remove at least a portion of an offset by external light incident into the sixteenth light detector PD16 and having an intensity of N/16.

The signal processor 220 may further include a plurality of amplifiers Amp provided based on a one-on-one correspondence with respect to the plurality of TIAs t1, t2, t3, . . . , and t16. Each of the plurality of amplifiers Amp may be incorporated to each of the plurality of offset removal filters o1, o2, o3, . . . , and o16. However, the plurality of amplifiers Amp are not limited thereto and may be separately provided from the plurality of offset removal filters o1, o2, o3, . . . , and o16. Each of the plurality of amplifiers Amp may amplify a value of a signal, in which at least a portion of an offset is removed by each of the plurality of offset removal filters o1, o2, o3, . . . , and o16.

The signal processor 220 may include signal summers 80 corresponding to the one or more light receiving areas 20, respectively. For example, the signal summers 80 may include a first signal summer configured to sum voltage signals converted by the plurality of TIAs t1, t2, t3, . . . , and t16 respectively corresponding to the plurality of light detectors PD1, PD2, PD3, . . . , and PD16 included in a first light receiving area from among at least one of light receiving areas 20. Also, the signal summers 80 may include a second signal summer configured to sum voltage signals converted by the plurality of TIAs t1, t2, t3, . . . , and t16 respectively corresponding to the plurality of light detectors PD1, PD2, PD3, . . . , and PD16 included in a second light receiving area from among at least one of light receiving areas 20.

The plurality of offset removal filters o1, o2, o3, . . . , and o16 may be provided between the plurality of TIAs t1, t2, t3, . . . , and t16 and the signal summers 80. Accordingly, signals, in which at least a portion of an offset is removed by each of the plurality of offset removal filters o1, o2, o3, . . . , and o16, may be summed by the signal summers 80.

The signals summed by the signal summers 80 may be transmitted to the processor 30 included in the controller 300. The processor 30 may include a plurality of comparators 91 and a plurality of time counters 92, the comparators 91 and the time counters 92 each corresponding to at least one of light receiving areas 20, respectively. The time counters 92 may be realized as a time to digital converter (TDC). Also, the processor 30 may include a plurality of analog-to-digital converters (ADCs) 93 and a plurality of TCSPCs 94, the plurality ADCs 93 and the plurality of TCSPCs 94 each corresponding to at least one of light receiving areas 20, respectively. FIG. 4 illustrates that the processor 30 includes one comparator 91, one time counter 92, one ADC 93, and one TCSPCs 94. However, example embodiments of the disclosure are not limited thereto. The processor 30 may include the plurality of comparators 91, the plurality of time counters 92, the plurality of ADCs 93, and the plurality of TCSPCs 94. For example, when the light receiver 210 includes the plurality of light receiving areas 20, the processor 30 may include the plurality of comparators 91, the plurality of time counters 92, the plurality of ADCs 93, and the plurality of TCSPCs 94, each being provided in the number corresponding to the number of light receiving areas 20.

The plurality of comparators 91 may generate a predetermined digital signal by comparing the signal transmitted from the signal summers 80 with a predetermined reference value. When the predetermined digital signal is input from each of the plurality of comparators 91, each of the plurality of time counters 92 may measure a ToF of light by calculating how many cycles clock signals are generated from a time point of light radiation from the light transmitter 100. Also, each of the plurality of time counters 92 may store information about each of the measured ToFs of the light in a register. The plurality of ADCs 93 may generate a predetermined digital signal by sampling the signals transmitted from the signal summers 80. The plurality of TCSPCs 94 may measure a ToF of light by using the predetermined digital signal that is input from each of the plurality of ADCs 93.

The electrical signals converted, having a removed offset, and amplified via the signal processor 220 may be transmitted to the controller 300. The controller 300 may be electrically connected with the light transmitter 100 and the light receiver 210. The controller 300 may transmit an electrical signal to the light transmitter 100 to control the light transmitter 100 to emit light having a specific wavelength and energy. Furthermore, when the light transmitter 100 radiates light onto a predetermined pixel px of a field of view, the controller 300 may transmit an electrical signal to the light receiver 210 to control any one of the at least one of light receiving areas 20, corresponding to the predetermined pixel px, to operate and receive the light.

The processor 30 may analyze the received electrical signals and analyze the presence, a location, a shape, a property, etc. of the object OBJ. The processor 30 may perform, for example, a calculation for measuring the ToF and determination of a three-dimensional shape of the object OBJ based on the measured ToF, or the processor 30 may perform analyses of a type, an element, a concentration, and a property of the object OBJ based on a Raman analysis.

The processor 30 may use various calculation methods. For example, a direct time-measuring method may project a pulse ray onto the object OBJ and measure a time, for which the light is reflected from the object OBJ, by using a timer, to obtain a distance. A correlation method may project a pulse ray onto the object OBJ and measure a distance based on a brightness of the light reflected from the object OBJ. A phase delay measuring method may project a continuous wave ray, such as a sine wave, onto the object OBJ and sense a phase difference of the light reflected from the object OBJ and convert the sensed phase difference into a distance.

The processor 30 may transmit a result of the calculation, that is, information about the shape, the location, and the property of the object OBJ, to another unit. For example, the information may be transmitted to an autonomous driving device requiring information about a three-dimensional shape, an operation, a location, etc. of the object OBJ. Alternatively, the information may be transmitted to a medical device using information about the property of the object OBJ, for example, biometric information. Alternatively, the other unit to which the result is transmitted may include a display device or a printer configured to output the result. In addition, the other unit may include, but is not limited to, a smartphone, a cellular phone, a personal digital assistant (PDA), a laptop, a personal computer (PC), and other mobile or non-mobile computing devices.

The LiDAR device 1000 may include a memory (not shown) storing programs and various data for the operations performed by the controller 300.

The LiDAR device 1000 may be used as a sensor for obtaining in real time three-dimensional information about a front object, and thus, may be applied to an autonomous driving device, such as an unmanned vehicle, an autonomous vehicle, a robot, a drone, etc. The LiDAR device 1000 may scan the object OBJ by simultaneously using a plurality of scan lines, and thus, the object OBJ may be analyzed at a high speed.

Figure 5:
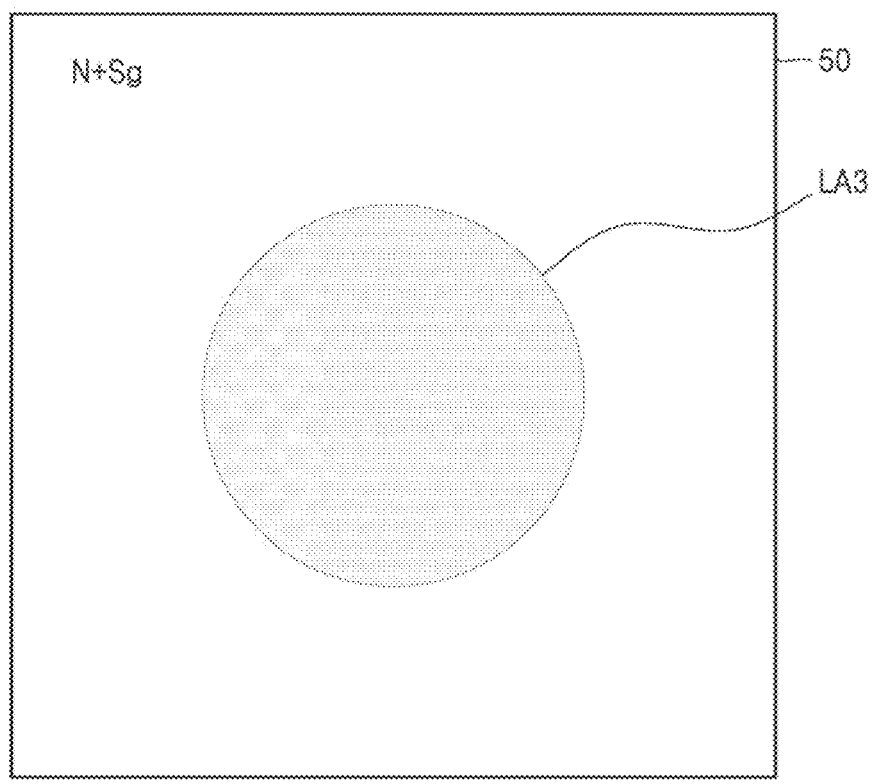
FIG. 5 is a schematic diagram of an example structure of a light receiving area, according to a comparative embodiment.
Figure 6:
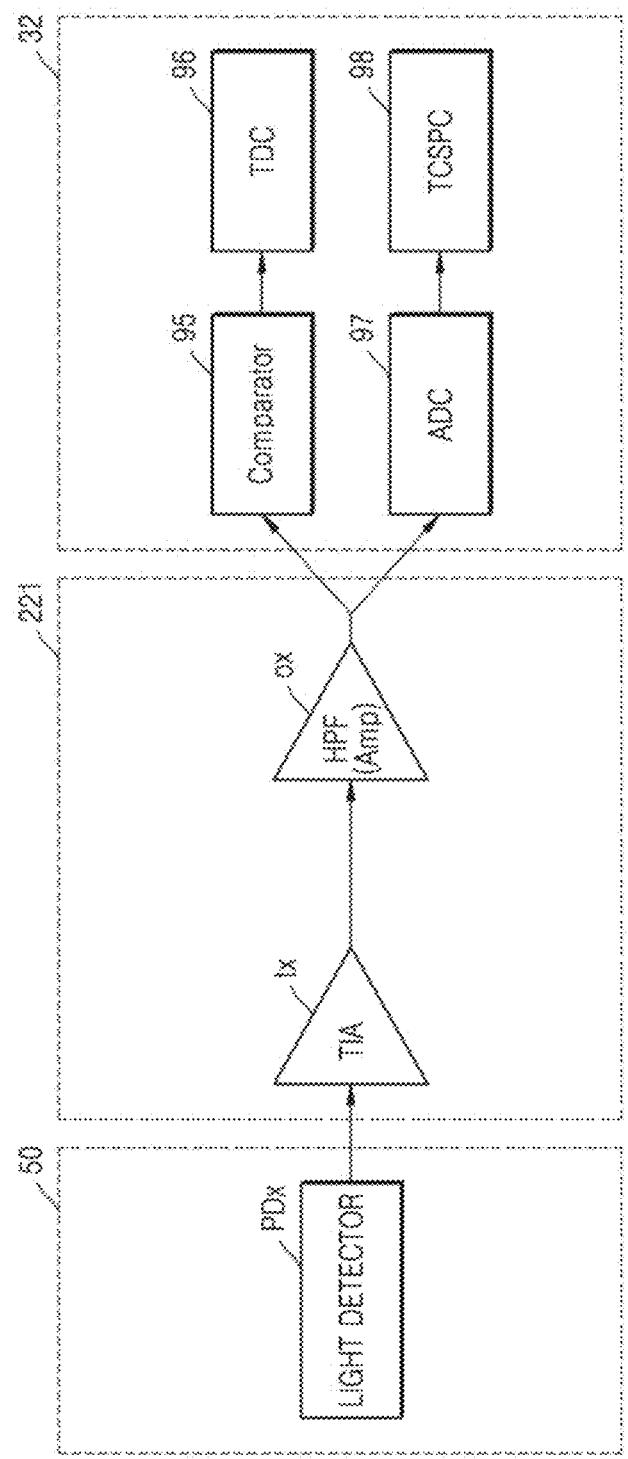
FIG. 6 is a schematic diagram of example structures of a light receiving area, a signal processor, and a processor, according to a comparative embodiment.

FIG. 5 is a schematic diagram of an example structure of a light receiving area 50, according to a comparative embodiment. FIG. 6 is a schematic diagram of example structures of the light receiving area 50, a signal processor 221, and a processor 32, according to a comparative embodiment.

Referring to FIG. 5, an incident area LA3 of light that is emitted from the emitter 10 toward the object OBJ, reflected from the object OBJ, and incident into the light receiving area 50 according to the comparative embodiment may be the same as the incident area LA1 of the light of FIG. 2. When the same amount of light is incident, a method, performed by the light receiving area 50 according to the comparative embodiment, of receiving the light and a method, performed by the light receiving area 20, of receiving the light FIG. 2 are different from each other, as described below.

The light receiving area 50 according to the comparative embodiment may not include a sub-light receiving area. Referring to FIG. 6, the light receiving area 50 may include one light detector PDx. For example, as illustrated in FIG. 5, one light detector PDx having an area corresponding to the total area of the light receiving area 50 may be provided. Accordingly, when an intensity of the light that is emitted from the emitter 10, reflected by the object OBJ, and incident into the light receiving area 50 is "Sg," an intensity of external light is "N," a total intensity of the light that is incident into the light receiving area 50 may be "Sg+N." The light receiving area 50 according to a comparative embodiment may receive the incident light by using one light detector PDx. In other words, the light receiving area 50 may not receive the incident light by a plurality of sub-light receiving areas divided from the light receiving area 50. Thus, the intensity of the external light received by the light detector PDx included in the light receiving area 50 may be "N," which is greater than an intensity "N/16" of external light received by each of the plurality of light detectors PD1, PD2, PD3, . . . , and PD16 of FIG. 4.

A current generated by the light detector PDx included in the light receiving area 50 according to the comparative embodiment may be transmitted to the signal processor 221. The signal processor 221 may include a TIA tx provided based on a one-on-one correspondence with respect to the light detector PDx. Also, the signal processor 221 may include an offset removal filter ox and an amplifier Amp each provided based on a one-on-one correspondence with respect to the TIA tx. The amplifier Amp may be incorporated to the offset removal filter ox. The offset removal filter ox may remove at least a portion of an offset by the external light having the intensity of N.

A signal processed by the signal processor 221 may be transmitted to the processor 32. The processor 32 may include a comparator 95 and a time counter 96 corresponding to the light receiving area 50. The time counter 96 may be a Time to Digital Converter (TDC). Also, the processor 32 may include a plurality of ADCs 97 and a plurality of TCSPCs 98 corresponding to the light receiving areas 50, respectively.

Figure 7:
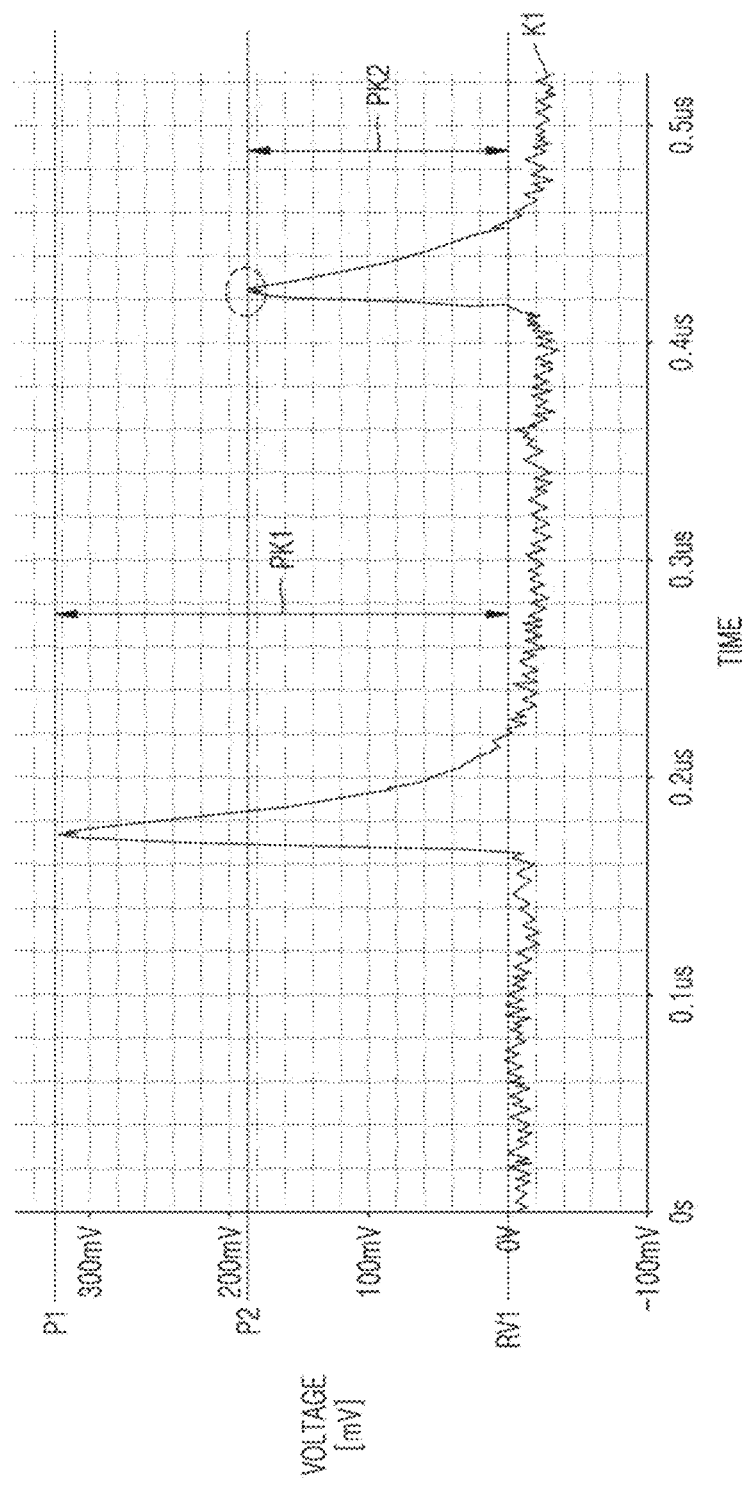
FIG. 7 is a graph of a first curve indicating, over a lapse of time, results of an electrical signal processed by the signal processor of FIG. 6, wherein the electrical signal is based on light that is received by a light detector when there is no external light, the light detector being included in the light receiving area according to the comparative embodiment of FIG. 5.
Figure 8:
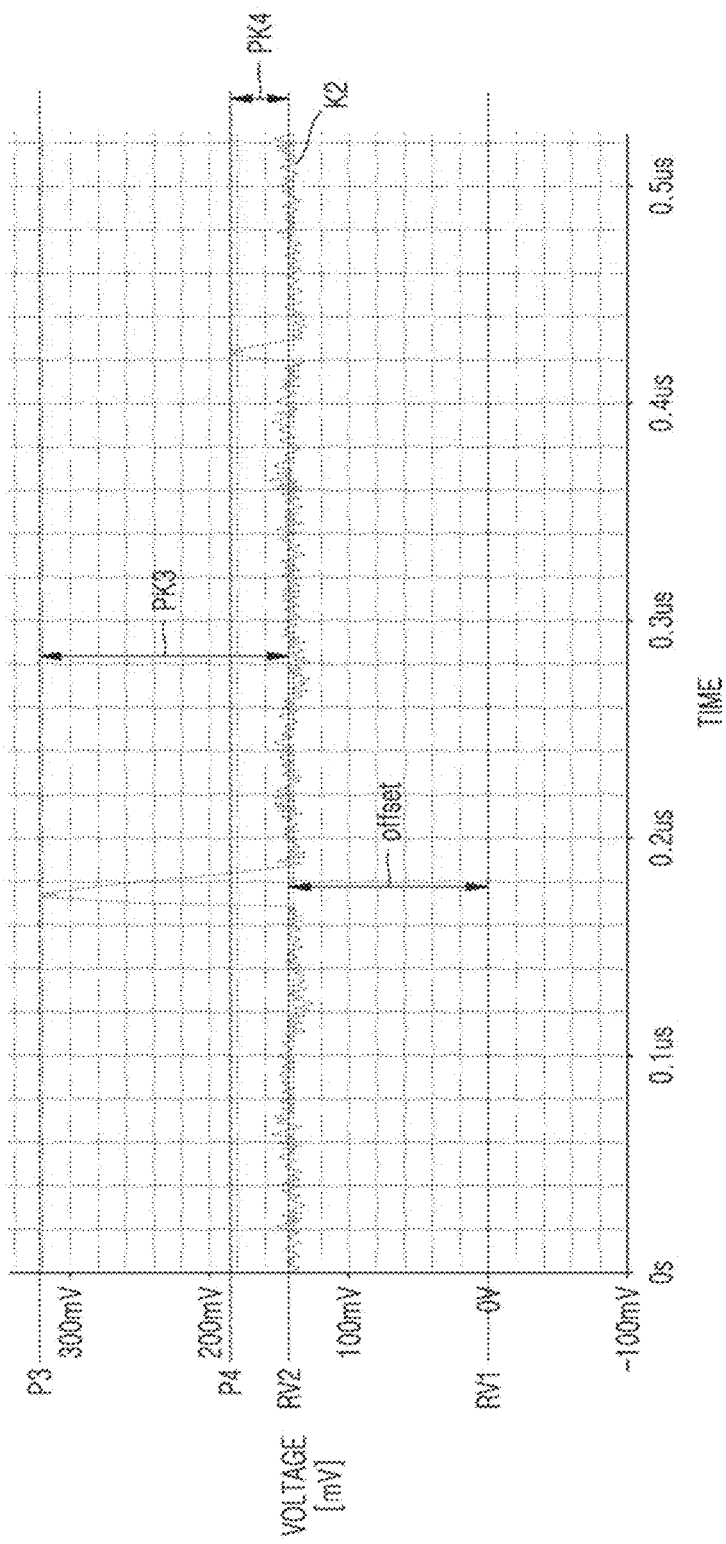
FIG. 8 is a graph of a second curve indicating, over a lapse of time, results of an electrical signal processed by the signal processor of FIG. 6, wherein the electrical signal is based on light that is received by a light detector when there is external light, the light detector being included in the light receiving area according to the comparative embodiment of FIG. 5.

FIG. 7 is a graph of a first curve K1 indicating, over a lapse of time, results of an electrical signal processed by the signal processor 221 of FIG. 6, wherein the electrical signal is based on light that is received by the light detector PDx when there is no external light, the light detector PDx being included in the light receiving area 50 according to the comparative embodiment of FIG. 5. FIG. 8 is a graph of a second curve K2 indicating, over a lapse of time, results of an electrical signal processed by the signal processor 221 of FIG. 6, wherein the electrical signal is based on light that is received by the light detector PDx when there is external light, the light detector PDx being included in the light receiving area 50 according to the comparative embodiment of FIG. 5. Horizontal axes of the graphs of FIGS. 7 and 8 indicate time, and vertical axes of the graphs of FIGS. 7 and 8 indicate an amplitude of a voltage signal.

Referring to FIG. 7, according to the first curve K1, when there is no external light (for example, when light is received indoors), electrical signals according to the light that is emitted from the emitter 10 (FIG. 1) and reflected by the object OBJ may be detected by the light detector PDx in a first section (about 0.16 µs to about 0.22 µs) and a second section (about 0.42 µs to about 0.48 µs). The electrical signals detected by the light detector PDx may be processed by the signal processor 221.

A first peak value P1 and a second peak value P2 of the electrical signals according to the light from the emitter 10, the electrical signals being measured in the first section and the second section, respectively, may be about 320 mV and about 180 mV, respectively. The first peak value P1 and the second peak value P2 may be generated by the light emitted and incident from the emitter 10. Here, the first peak value P1 and the second peak value P2 may be different from each other, because the light emitted and incident from the emitter 10 may have different intensities in the first and second sections.

Also, according to the first curve K1, an electrical signal (about 0 mV) detected in a section other than the first and second sections, that is, in a section in which the light from the emitter 10 is not received, may be indicated by a first reference value RV1. In this case, a difference between the first peak value P1 and the first reference value RV1 may be referred to as a first difference PK1, and a difference between the second peak value P2 and the first reference value RV1 may be referred to as a second difference PK2.

Referring to FIGS. 5 and 8, according to the second curve K2, when there is external light, electrical signals according to the light emitted from the emitter 10 (FIG. 1) and reflected by the object OBJ may be detected by the light detector PDx in a third section (about 0.16 µs through about 0.19 µs) and a fourth section (about 0.42 µs through about 0.43 µs). The electrical signals detected by the light detector PDx may be processed by the signal processor 221.

A third peak value P3 and a fourth peak value P4 of the electrical signals according to the light from the emitter 10, the electrical signals being measured in the third section and the fourth section, respectively, may be about 320 mV and about 180 mV, respectively. The third peak value P3 and the fourth peak value P4 may be generated by the light emitted and incident from the emitter 10. Here, the third peak value P3 and the fourth peak value P4 may be different from each other, because the light emitted and incident from the emitter 10 may have different intensities in the third and fourth sections.

Also, according to the second curve K2, an electrical signal (about 140 mV) detected in a section other than the third and fourth sections, that is, in a section in which the light from the emitter 10 is not received, may be indicated by a second reference value RV2. The second reference value RV2 may be an offset by the external light. For example, an offset may occur from the first reference value RV1 by the external light (light having the intensity of N) of FIG. 5, to generate the second reference value RV2. Thus, the second reference value RV2 may be greater than the first reference value RV1. In this case, a difference between the third peak value P3 and the second reference value RV2 may be referred to as a third difference PK3, and a difference between the fourth peak value P4 and the second reference value RV2 may be referred to as a fourth difference PK4.

Referring to FIGS. 7 and 8, when the intensities of the light emitted from the emitter 10 and reflected and incident from the object OBJ are the same between a case when there is external light and a case when there is no external light, the peak values of the electrical signals according to the light received by the light detector PDx of FIG. 5 may be the same between the both cases. For example, the first peak value P1 may be the same as the third peak value P3, and the second peak value P2 may be the same as the fourth peak value P4.

However, in a section in which the light from the emitter 10 is not received, the electrical signal detected by the light detector PDx when there is external light may be higher than the electrical signal detected by the light detector PDx when there is no external light. For example, the second reference value RV2 when there is external light may be higher than the first reference value RV1 when there is no external light. Accordingly, the third difference PK3 may be less than the first difference PK1, and the fourth difference PK4 may be less than the second difference PK2. As differences between the peak values P1, P2, P3, and P4 and the reference values RV1 and RV2 are increased, detection of the peak by the comparator 95 (FIG. 6) may be more accurately performed, and thus, measuring of the ToF of the light may be more accurately performed. Thus, because the third difference PK3 is less than the first difference PK1, and the fourth difference PK4 is less than the second difference PK2, the measurement of the ToF of the light by the processor 32 may be less accurate when there is external light as shown in FIG. 8 than when there is no external light as shown in FIG. 7.

Figure 9:
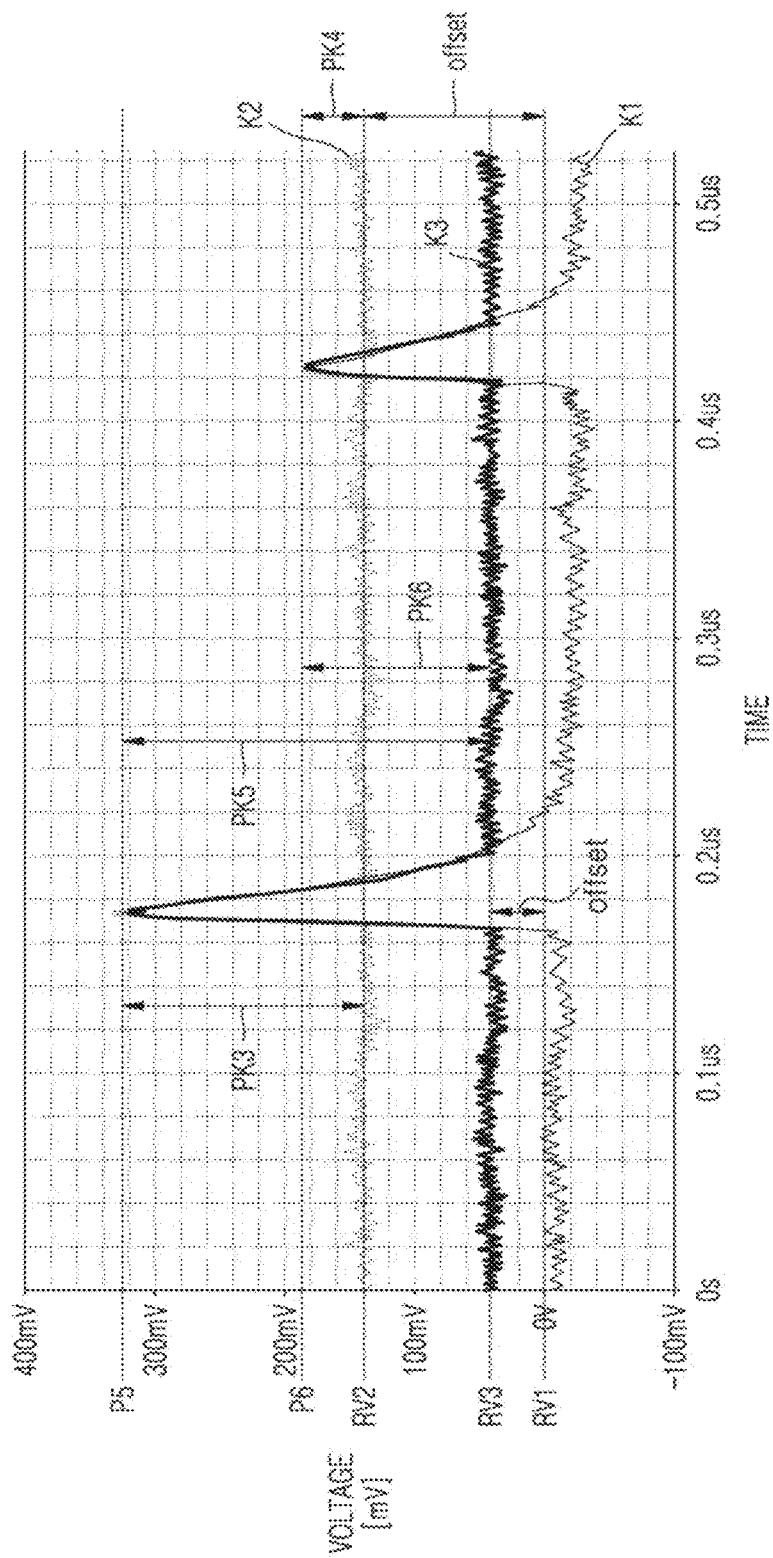
FIG. 9 shows a comparison between a graph of a third curve and the graphs of the first and second curves of FIGS. 7 and 8, wherein the graph of the third curve indicates, over a lapse of time, results of an electrical signal processed by the signal processor of FIG. 4, wherein the electrical signal is based on light that is received by a plurality of light detectors when there is external light, the plurality of light detectors being included in the one or more light receiving areas of FIG. 2.

FIG. 9 shows a comparison between a graph of a third curve K3 and the graphs of the first and second curves K1 and K2 of FIGS. 7 and 8, wherein the graph of the third curve K3 indicates, over a lapse of time, results of an electrical signal processed by the signal processor 220 of FIG. 4, wherein the electrical signal is based on light that is received by the plurality of light detectors PD1, PD2, PD3, . . . , and PD16 (FIG. 4) when there is external light, the plurality of light detectors being included in the one or more light receiving areas 20 of FIG. 2. The horizontal axis of the graph of FIG. 9 indicates time, and the vertical axis of the graph of FIG. 9 indicates an amplitude of a voltage signal.

Referring to FIGS. 2 and 9, according to the third curve K3, when there is external light, electrical signals according to the light that is emitted from the emitter 10 (FIG. 1) and reflected and incident from the object OBJ may be detected by some light detectors PD6, PD7, PD10, and PD11 from among the plurality of light detectors PD1, PD2, PD3, . . .

, and PD16, in a fifth section (about 0.16 μs to about 0.2 μs) and a sixth section (about 0.42 μs to about 0.44 μs). The electrical signals detected by the plurality of light detectors PD1, PD2, PD3, . . . , and PD16 may be processed by the signal processor 220.

A fifth peak value P5 and a sixth peak value P6 of the electrical signals according to the light from the emitter 10, the electrical signals being measured in the fifth section and the sixth section, respectively, may be about 320 mV and about 180 mV, respectively. The fifth peak value P5 and the sixth peak value P6 may be generated by the light emitted and incident from the emitter 10. Here, the fifth peak value P5 and the sixth peak value P6 may be different from each other, because the light emitted and incident from the emitter 10 may have different intensities in the fifth and sixth sections.

Also, according to the third curve K3, an electrical signal (about 40 mV) detected in a section other than the fifth and sixth sections, that is, in a section in which the light from the emitter 10 is not received, may be indicated by a third reference value RV3. The third reference value RV3 may be an offset by the external light. For example, an offset may occur from the first reference value RV1 by the external light (light having the intensity of N/16) detected by each of the plurality of light detectors PD1, PD2, PD3, . . . , and PD16 of FIG. 2, to generate the third reference value RV3. Thus, the third reference value RV3 may be greater than the first reference value RV1. In this case, a difference between the fifth peak value P5 and the third reference value RV3 may be referred to as a fifth difference PK5, and a difference between the sixth peak value P6 and the third reference value RV3 may be referred to as a sixth difference PK6.

Referring to FIGS. 2 and 5 again, the intensities of the external light that is incident into the light receiving areas 20 according to an example embodiment and the light receiving area 50 according to the comparative embodiment may be same to be "N." However, as illustrated in FIG. 9, the third reference value RV3 and the second reference value RV2 both corresponding to the offsets by the external light having the intensity of N may be different from each other. For example, the third reference value RV3 may be less than the second reference value RV2. The reason may be as below.

First, referring to FIGS. 5 and 6, in the light receiving area 50 according to the comparative embodiment, the external light having the intensity of N may be received by one light detector PDx. At least a portion of the offset by the external light having the intensity of N and detected by one light detector PDx may be removed by the offset removal filter ox connected to the light detector PDx. Like this, the offset by the external light, corresponding to the second reference value RV2 of FIG. 9, may be a result obtained by removing at least a portion of a signal detected by the light detector PDx of FIG. 6 by using the offset removal filter ox connected to the light detector PDx.

However, referring to FIGS. 2 and 4, in any one of the at least one of light receiving areas 20 according to an example embodiment, the external light having the intensity of N may be received by each of the plurality of light detectors PD1, PD2, PD3, . . . , and PD16. in a state in which the external light is divided into light having the intensity of N/16. At least a portion of an offset by the light having the intensity of N/16 and detected by each of the plurality of light detectors PD1, PD2, PD3, . . . , and PD16 may be removed by each of the plurality of offset removal filters o1, o2, o3, . . . , and o16 respectively connected to the plurality of light detectors PD1, PD2, PD3, . . . , and PD16. Like this, the offset by the external light, corresponding to the third reference value RV3 of FIG. 9, may be a result obtained by removing at least a portion of each of the signals detected by the plurality of light detectors PD1, PD2, PD3, . . . , and PD16 of FIG. 4 by using each of the plurality of offset removal filters o1, o2, o3, . . . , and o16, and then summing the signals.

Like this, the second reference value RV2 of FIG. 9 may be the result obtained by removing the offset by using one offset removal filter ox with respect to the external light having the intensity of N, and the third reference value RV3 of FIG. 9 may be the result obtained by removing the offset by using the plurality of offset removal filters o1, o2, o3, . . . , and o16, with respect to the external light having the intensity of N, and thus, the third reference value RV3 may be less than the second reference value RV2.

Furthermore, referring to FIG. 9 again, the fifth difference PK5 may be greater than the third difference PK3, and the sixth difference PK6 may be greater than the fourth difference PK4. Accordingly, when the light is received by any one of at least one of light receiving areas 20 according to an example embodiment illustrated in FIG. 2, the processor 30 (FIG. 1) may measure the ToF of the light more accurately, compared to when the light is received by the light receiving area 50 according to the comparative embodiment of FIG. 5. The reason that the fifth difference PK5 may be greater than the third difference PK3, and the sixth difference PK6 may be greater than the fourth difference PK4 may be as below.

The third difference PK3 and the fourth difference PK4 may be obtained by receiving both the external light having the intensity of N and the light from the emitter 10 having the intensity of Sg by using one light detector PDx included in the light receiving area 50 according to the comparative embodiment of FIGS. 5 and 6. However, the fifth difference PK5 and the sixth difference PK6 may be obtained by receiving the external light and the light from the emitter 10 having the intensity of Sg by separately using some light detectors PD6, PD7, PD10, and PD11 from among the plurality of light detectors PD1, PD2, PD3, . . . , and PD16 included in any one of at least one of light receiving areas 20 according to an example embodiment illustrated in FIGS. 2 and 4, and then summing the received light.

In this case, a ratio (Sg/N) of the light from the emitter 10 to the external light received by the light detector PDx included in the light receiving area 50 according to the comparative embodiment may be less than a ratio ((Sg/4)/(N/16)=4*(Sg/N)) of the light from the emitter 10 to the external light received by each of some light detectors PD6, PD7, PD10, and PD11 included in any one of at least one of light receiving areas 20 according to an example embodiment. As described above, the ratio of the light from the emitter 10 to the external light received by the light detectors, according to the comparative embodiment, and the ratio of the light from the emitter 10 to the external light received by the light detectors, according to an example embodiment, may be different from each other. Accordingly, the fifth difference PK5 may be greater than the third difference PK3, and the sixth difference PK6 may be greater than the fourth difference PK4.

Figure 10:
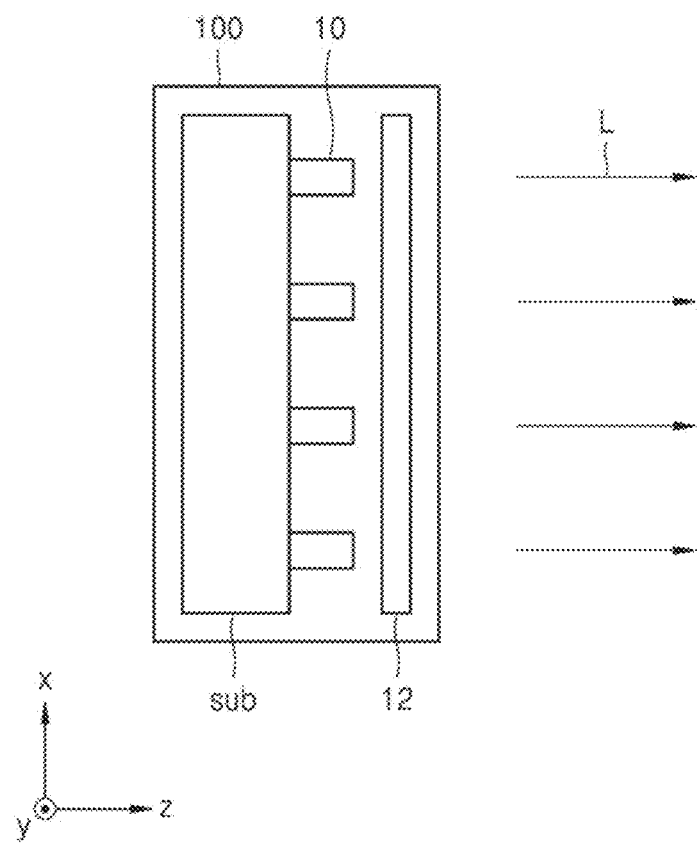
FIG. 10 is a schematic diagram of an example structure of a light transmitter which may be applied to the LiDAR device of FIG. 1.

FIG. 10 is a schematic diagram of an example structure of the light transmitter 100 which may be included in the LiDAR device 1000 of FIG. 1.

Referring to FIG. 10, the light transmitter 100 may include the plurality of emitters 10. For example, the plurality of emitters 10 may be arranged on a substrate sub to be apart from each other. The plurality of emitters 10 may be arranged in a direction in parallel with each other. For example, the plurality of emitters 10 may be arranged in parallel with each other in a first direction (an x axis direction) and may emit light in a second direction (a z axis direction). The plurality of emitters 10 may be implemented as a plurality of different point light sources, and light L emitted from the plurality of emitters 10, may travel in a parallel direction, respectively. The first direction (the x axis direction) and the second direction (the z axis direction) may be perpendicular to each other.

Also, the light transmitter 100 may further include a collimator 12 configured to collimate the light emitted from the emitters 10. FIG. 10 illustrates that the collimator 12 is provided on the entire surface of the plurality of emitters 10. However, an example embodiment is not limited thereto. Even when the light transmitter 100 includes one emitter 10, the light transmitter 100 may include the collimator 12. The collimator 12 may be provided on a propagation path of light emitted from the emitters 10. The light emitted from the plurality of emitters 10 may be collimated by the collimator 12.

Figure 11:
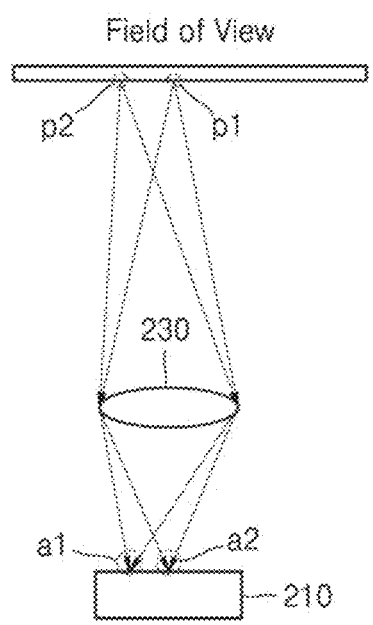
FIG. 11 is a schematic diagram of an example structure of a light-receiving optical element configured to focus light in the light receiver included in a light detection device of FIG. 1.

FIG. 11 is a schematic diagram of an example structure of a light-receiving optical element 230 configured to focus light in the light receiver 210 included in the light detection device 200 of FIG. 1.

Referring to FIG. 11, the LiDAR device 1000 may further include the light-receiving optical element 230 arranged on the entire surface of the light receiver 210 to focus the light reflected by the object OBJ in the light receiver 210. The light-receiving optical element 230 may focus the light reflected by the object OBJ in a plurality of pixels a1 and a2 of the light receiver 210. The plurality of pixels a1 and a2 of the light receiver 210 may correspond to at least one of light receiving areas 20 of FIG. 1, respectively. For example, the light-receiving optical element 230 may include a focusing lens configured to focus incident light. The light from a plurality of pixels p1 and p2 of a field of view formed by the light transmitter 100 may be focused in the plurality of pixels a1 and a2 of the light receiver 210, respectively, by the light-receiving optical element 230. For example, the light from a first pixel p1 included in the field of view may be focused in a first pixel a1. Also, the light from a second pixel p2 included in the field of view may be focused in a second pixel a2.

Figure 12:
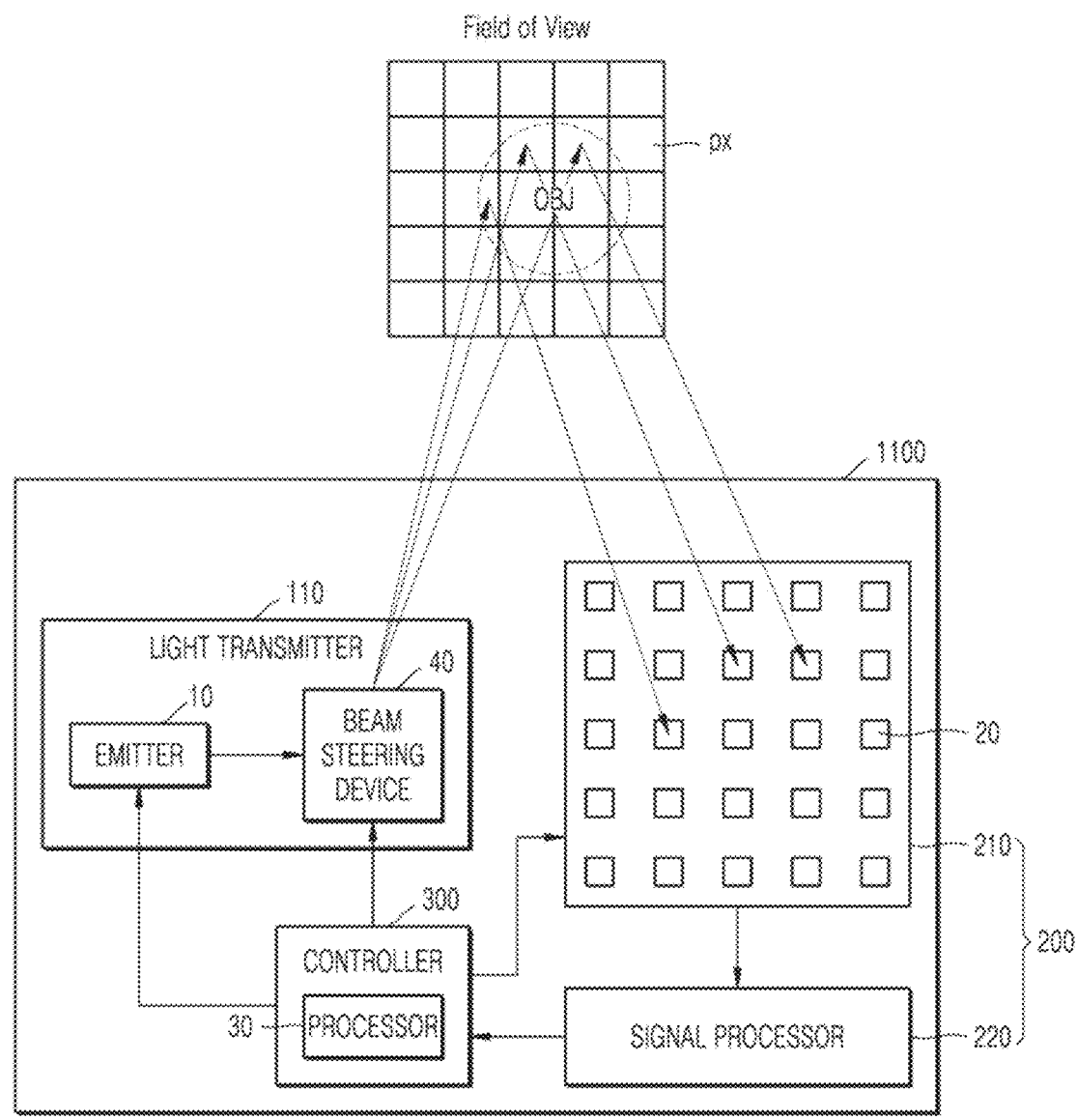
FIG. 12 is a schematic diagram of an example structure of a LiDAR device according to another example embodiment.

FIG. 12 is a schematic diagram of an example structure of a LiDAR device 1100, according to another example embodiment. The LiDAR device 1100 of FIG. 12 may be substantially the same as the LiDAR device 1000 of FIG. 1, except that the LiDAR device 1100 may further include a beam steering device 40. When describing FIG. 12, repeated aspects with respect to FIG. 11 will not be described.

A light transmitter 110 may include the beam steering device 40 configured to steer a propagation direction of light emitted from the emitter 10 and traveling toward the object OBJ. The beam steering device 40 may change the propagation direction of the light emitted from the emitter 10. For example, the beam steering device 40 may include a predetermined optical system including a mirror, a lens, etc. configured to change a propagation direction of the light emitted from the emitter 10. For example, the beam steering device 40 may include an optical system including two mirrors rotatable respectively based on two axes crossing each other. However, the beam steering device 40 is not limited thereto and may include various devices configured to change the travel path of the light emitted from the emitter 10. The propagation direction of the light emitted from the emitter 10 may be sequentially changed by the beam steering device 40, and thus, a field of view having a plurality of pixels px may be formed.

Figure 13:
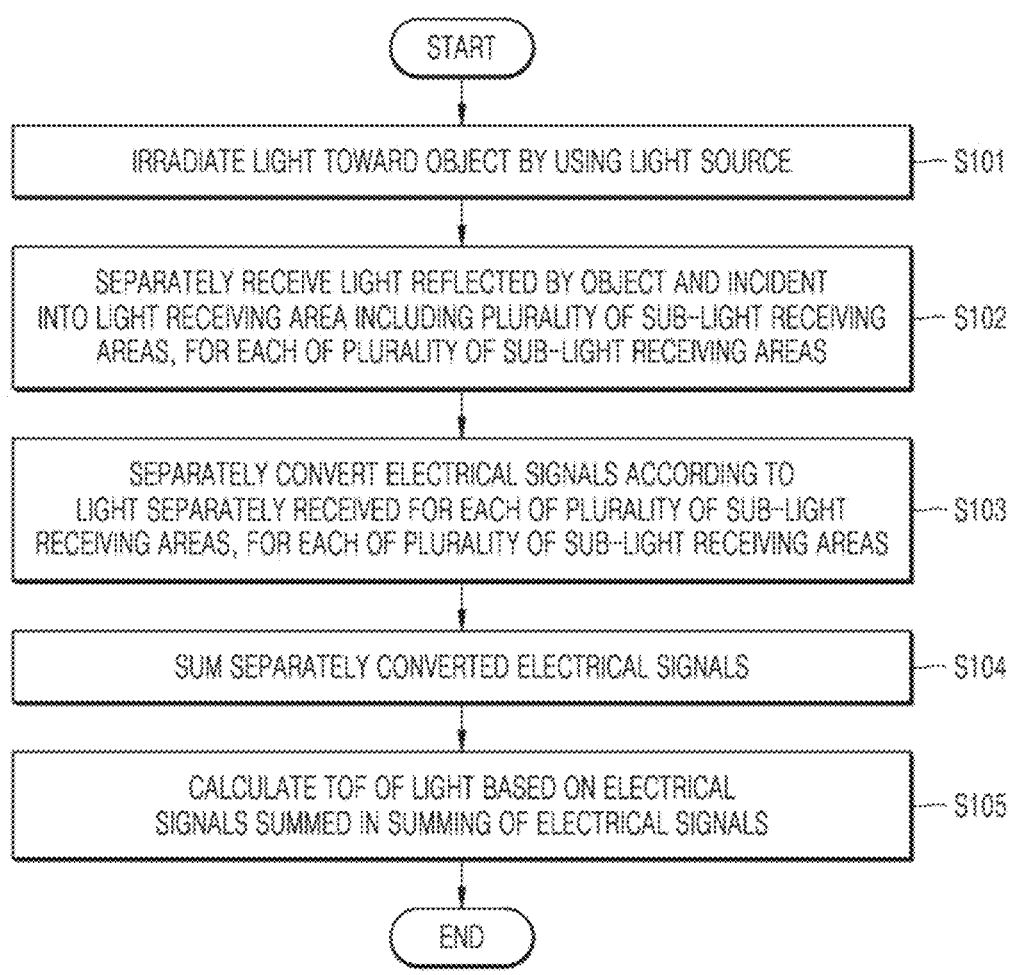
FIG. 13 is a flowchart of a method of measuring a distance, according to an example embodiment.

FIG. 13 is a flowchart of a method of measuring a distance, according to an example embodiment.

Referring to FIG. 13, the method of measuring a distance according to an example embodiment may include operation S101 in which light is radiated toward an object, operation S102 in which light reflected by the object is received, operation S103 in which electrical signals according to the received light are modulated, operation S104 in which the modulated electrical signals are summed, and operation S105 in which a ToF of the light is calculated.

In operation S101, light may be radiated toward the object by using an emitter including a light-emitting device and generating a point light source. The point light source refers to a light source corresponding to one pixel with respect to the object. One emitter may include one light-emitting device. However, it is not limited thereto. One emitter may include a plurality of light-emitting devices, and in this case, the plurality of light-emitting devices may form one point light source. When the point light source includes a plurality of light emitting devices, the light emitted from the point light source has a greater intensity than the light radiated from another point light source including a single light-emitting device. In operation S101, the light emitted from the emitter may be radiated onto a predetermined area in which the object is included. For example, the predetermined area may include a plurality of pixels, and the light emitted from the emitter may be sequentially radiated onto the plurality of pixels. In other words, the light emitted from the point light source may correspond to any one of the plurality of pixels in the predetermined area in which the object is included. In addition, a propagation direction of the light from the point light source may be changed so that the light from the point light source may be sequentially radiated onto the plurality of pixels in the predetermined area in which the object is included. To this end, a beam steering device configured to change the propagation direction of the light emitted from the emitter may be used.

In operation S101, the light may be radiated onto the object by using a plurality of emitters. When the light is radiated onto the object by using the plurality of emitters, the light may be radiated onto the predetermined area in which the object is included, in a shorter time period, compared to when the light is radiated onto the object by using one emitter.

In operation S102, a light receiving area configured to receive the light emitted from the point light source (i.e., the emitter) and reflected from the object may be divided into a plurality of sub-light receiving areas so that the light may be separately received by each of plurality of sub-light receiving areas. For example, a plurality of light detectors arranged in the plurality of sub-light receiving areas, respectively, may be used, and the incident light may be separately received by each of the plurality of sub-light receiving areas.

One light receiving area may correspond to any one pixel of the plurality of pixels included in the predetermined area in which the object is included. For example, the light, emitted from the point light source (i.e., the emitter) and reflected and incident from any one of the plurality of pixels included in the predetermined area in which the object is included, may be received by one light receiving area. One light receiving area may be divided into a plurality of sub-light receiving areas. Thus, a size of each of the plurality of sub-light receiving areas may be less than an area of an incident area of the light emitted from the point light source (i.e., the emitter) and reflected and incident from the object.

In operation S103, electrical signals according to the light received by the plurality of light detectors may be separately converted for each of the plurality of sub-light receiving areas. For example, a plurality of TIAs respectively connected to the plurality of light detectors may be used to convert current signals detected by the plurality of light detectors into voltage signals.

For example, a current signal according to light received by a first light detector provided in a first sub-light receiving area from among the plurality of sub-light receiving areas may be converted into a first voltage signal by using a first TIA. Also, a current signal according to light received by a second light detector provided in a second sub-light receiving area from among the plurality of sub-light receiving areas may be converted into a second voltage signal by using a second TIA. Based on this method, a current signal may be converted into a voltage signal for each of the plurality of sub-light receiving areas.

In operation S104, the voltage signal separately converted for each of the plurality of sub-light receiving areas in operation S103 may be summed. For example, signal summers respectively corresponding to the plurality of light receiving areas may be used to sum the voltage signals converted by the plurality of TIAs respectively corresponding to the plurality of light detectors included in one light receiving area. Accordingly, a voltage signal according to the light detected by one light receiving area may be obtained. When a plurality of light receiving areas are used, the plurality of signal summers respectively corresponding thereto may be used to obtain a plurality of voltage signals respectively corresponding to the plurality of light receiving areas.

In operation S105, the ToF of the light may be calculated based on the voltage signal summed in operation S104. For example, in operation S105, the ToF of the light may be calculated by using a processor configured to calculate the ToF of the light. The processor may include, for example, an ADC, a TCSPC, a TDC, a comparator, etc.

The method of measuring a distance according to an example embodiment may further include, after operation S103 in which the electrical signals are separately converted for each of the plurality of sub-light receiving areas, and before operation S104 in which the converted electrical signals are summed, an operation of separately removing offsets with respect to the separately converted electrical signals, for each of the plurality of sub-light receiving areas.

The example embodiments described above are only examples. One of ordinary skill in the art may understand that various modifications and equivalent embodiments are possible based on the example embodiments. Thus, the true technical protection range according to the example embodiments shall be defined by the technical concept of the disclosure stated in the claims below.

According to the light detection device, the LiDAR device including the light detection device, and the method of measuring a distance described above, by appropriately adjusting a size of the light detector included in the light detection device, noise received by the light detection device may be minimized, and thus, the ToF of light may be relatively more accurately measured.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A light detection device comprising:
a light receiver comprising a plurality of light detectors configured to receive light emitted from a light emitter toward an object and reflected by the object; and
a signal processor configured to process an electrical signal according to the light received by the light receiver,
wherein the light receiver comprises at least one light receiving area, each of the at least one light receiving area comprising a plurality of sub-light receiving areas,
the plurality of light detectors are provided in the plurality of sub-light receiving areas, respectively, and
the signal processor comprises:
a plurality of transimpedance amplifiers (TIAs) that have a one-on-one correspondence with the plurality of light detectors, and
at least one signal summer that has a one-on-one correspondence with the at least one light receiving area comprising the plurality of sub-light receiving areas, wherein the at least one signal summer is configured to sum a plurality of analog signals received through the plurality of TIAs.

2. The light detection device of claim 1, wherein each of the at least one light receiving area comprising the plurality of sub-light receiving areas corresponds to one pixel of the light receiver, and
wherein a number of the plurality of light detectors equal to a number of laser chips included in the emitter of the light detection device.

3. The light detection device of claim 1, wherein the plurality of sub-light receiving areas are provided by dividing any one of the at least one light receiving area into N areas, and N is a natural number.

4. The light detection device of claim 1, wherein a size of each of the plurality of sub-light receiving areas is less than a light incident area on which the light reflected from the object is incident.

5. The light detection device of claim 1, wherein the light receiver comprises a plurality of light receiving areas comprising the at least one light receiving area,
the signal processor comprises a plurality of signal summers comprising the at least one signal summer, the plurality of signal summers having the one-on-one correspondence with the plurality of light receiving areas,
the plurality of TIAs comprise a plurality of first TIAs and a plurality of second TIAs,
the plurality of light detectors comprise a plurality of first light detectors disposed in a first light receiving area among the plurality of light receiving areas, and a plurality of second light detectors disposed in a second light receiving area among the plurality of light receiving areas, and
the plurality of signal summers comprise:
a first signal summer configured to sum first voltage signals converted by the plurality of first TIAs that are connected to the plurality of first light detectors, respectively; and
a second signal summer configured to sum second voltage signals converted by the plurality of second TIAs that are connected to the plurality of second light detectors, respectively.

6. The light detection device of claim 1, wherein the plurality of TIAs are configured to convert the received light into a plurality of voltage signals, and
the signal processor comprises a plurality of offset removal filters that are connected to the plurality of TIAs, respectively, and that are configured to remove an offset voltage amount, which is caused by external light incident to the plurality of light detectors, from the plurality of voltage signals.

7. The light detection device of claim 1, wherein the signal processor comprises a plurality of amplifiers that are connected to the plurality of TIAs, respectively.

8. The light detection device of claim 1, wherein the plurality of light detectors comprise at least one of an avalanche photo diode and a single photon avalanche diode.

9. A light detection and ranging (LiDAR) device comprising:
a light emitter configured to emit light;
a light detection device comprising:
   a light receiver comprising a plurality of light detectors configured to receive the light emitted from the light emitter toward an object and reflected by the object; and
   a signal processor configured to process an electrical signal according to the light received by the light receiver; and
a processor configured to obtain a time of flight (ToF) of the light by using the electrical signal processed by the signal processor,
wherein the light receiver comprises at least one light receiving area, each of the at least one light receiving area comprising a plurality of sub-light receiving areas,
the plurality of light detectors are provided in the plurality of sub-light receiving areas, respectively, and
the signal processor comprises:
   a plurality of transimpedance amplifiers (TIAs) that have a one-on-one correspondence with the plurality of light detectors, and
   at least one signal summer that has a one-on-one correspondence with the at least one light receiving area comprising the plurality of sub-light receiving areas, wherein the at least one signal summer is configured to sum a plurality of analog amplified signals received through the plurality of TIAs.

10. The LiDAR device of claim 9, wherein each of the at least one light receiving area corresponds to one pixel of the light receiver.

11. The LiDAR device of claim 9, wherein the plurality of sub-light receiving areas are provided by dividing any one of the at least one light receiving area into N areas, and N is a natural number.

12. The LiDAR device of claim 9, wherein a size of each of the plurality of sub-light receiving areas is less than an area of a light incident area on which the light reflected from the object is incident.

13. The LiDAR device of claim 9, wherein the light receiver comprises a plurality of light receiving areas comprising the at least one light receiving area,
the signal processor comprises a plurality of signal summers comprising the at least one signal summer, wherein the plurality of signal summers have the one-on-one correspondence with the plurality of light receiving areas,
the plurality of TIAs comprise a plurality of first TIAs and a plurality of second TIAs,
the plurality of light detectors comprise a plurality of first light detectors disposed in a first light receiving area among the plurality of light receiving areas, and a plurality of second light detectors disposed in a second light receiving area among the plurality of light receiving areas, and
the plurality of signal summers comprises:
   a first signal summer configured to sum first voltage signals converted by the plurality of first TIAs that are connected to the plurality of first light detectors, respectively; and
   a second signal summer configured to sum second voltage signals converted by the plurality of second TIAs that are connected to the plurality of second light detectors, respectively.

14. The LiDAR device of claim 9, wherein the signal processor comprises a plurality of offset removal filters that are connected to the plurality of TIAs, respectively.

15. The LiDAR device of claim 9, wherein the signal processor comprises a plurality of amplifiers that are connected to the plurality of TIAs, respectively.

16. The LiDAR device of claim 9, further comprising a plurality of light emitters comprising the light emitter, wherein the plurality of light emitters are configured to emit a plurality of light beams to different positions in the object.

17. The LiDAR device of claim 9, further comprising a beam steering device configured to steer a travel direction of the light to have the light be incident on the object.

18. The LiDAR device of claim 9, further comprising a collimator configured to collimate the light emitted from the light emitter.

19. The LiDAR device of claim 9, further comprising a light-receiving optical element arranged on an entire surface of the light receiver and configured to focus the light reflected by the object onto the light detection device.

20. The LiDAR device of claim 9, wherein the light receiver comprises a plurality of light receiving areas, and
the plurality of light receiving areas is arranged in different light receiving locations to detect the light reflected from different locations of the object and incident into the different light receiving locations.

21. A method of measuring a distance, the method comprising:
radiating a plurality of light beams toward an object by using a light source;
receiving the plurality of light beams through a plurality of sub-light receiving areas, respectively, wherein the plurality of light beams that are radiated from the light source is reflected by the object and incident into a light receiving area comprising the plurality of sub-light receiving areas;
converting the plurality of light beams that are incident onto the plurality of sub-light receiving areas into a plurality of analog electrical signals;
summing the converted plurality of analog electrical signals; and
obtaining a time of flight (ToF) of the plurality of light beams based on a sum of the plurality of analog electrical signals.

22. The method of claim 21, further comprising, after performing the converting, and before performing the summing, removing offsets from the plurality of analog electrical signals, respectively, for each of the plurality of sub-light receiving areas.

23. The light detection device of claim 1, wherein the plurality of light detectors are configured to directly receive the light reflected from the object.

24. The light detection device of claim 1, wherein the plurality of TIAs are configured to convert the received light into a plurality of voltage signals, and the signal processor comprises a plurality of offset removal filters that are connected to the plurality of TIAs, respectively, and that are configured to remove an offset voltage amount, which is caused by external light incident to the plurality of light detectors, from the plurality of voltage signals.

* * * * *